(12) United States Patent
Huang et al.

(10) Patent No.: US 7,244,673 B2
(45) Date of Patent: Jul. 17, 2007

(54) INTEGRATION FILM SCHEME FOR COPPER / LOW-K INTERCONNECT

(75) Inventors: Tai-Chun Huang, Hsin-Chu (TW); Chih-Hsiang Yao, Hsin-Chu (TW); Yih-Hsiung Lin, Sanchung (TW); Tien-I Bao, Hsin-Chu (TW); Bi-Trong Chen, Hsin-Chu (TW); Yung-Cheng Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 10/706,156

(22) Filed: Nov. 12, 2003

(65) Prior Publication Data

US 2005/0098896 A1 May 12, 2005

(51) Int. Cl.
*H01L 21/469* (2006.01)

(52) U.S. Cl. ............... 438/622; 438/623; 257/758; 257/759

(58) Field of Classification Search ............ 257/758, 257/759; 438/118, 622, 623
See application file for complete search history.

(56) References Cited

U.S. PATENT DOCUMENTS

| | | | |
|---|---|---|---|
| 5,148,263 A | 9/1992 | Hamai | |
| 5,332,694 A | 7/1994 | Suzuki | |
| 5,372,969 A | 12/1994 | Moslehi | |
| 5,486,493 A | 1/1996 | Jeng | |
| 5,591,677 A | 1/1997 | Jeng | |
| 5,616,959 A | 4/1997 | Jeng | |
| 5,798,568 A | 8/1998 | Abercrombie et al. | |
| 5,937,324 A | 8/1999 | Abercrombie et al. | |
| 5,981,374 A | 11/1999 | Dalal et al. | |
| 6,069,400 A * | 5/2000 | Kimura et al. | 257/633 |
| 6,075,293 A | 6/2000 | Li et al. | |
| 6,124,198 A | 9/2000 | Moslehi | |
| 6,261,944 B1 | 7/2001 | Mehta et al. | |
| 6,479,380 B2 | 11/2002 | Furusawa et al. | |
| 2002/0130416 A1* | 9/2002 | Wang et al. | 257/758 |
| 2004/0026785 A1* | 2/2004 | Tomita | 257/758 |
| 2004/0251549 A1* | 12/2004 | Huang et al. | 257/758 |

* cited by examiner

*Primary Examiner*—Douglas W. Owens
(74) *Attorney, Agent, or Firm*—Slater & Matsil, L.L.P.

(57) ABSTRACT

A structure for a multi-level interconnect inter-level dielectric layer (ILD), a method of manufacturing thereof, and a semiconductor device including the ILD layer. The ILD layer includes a first low-dielectric constant material sub-layer, and a second low-dielectric constant material sub-layer disposed over the first low-dielectric constant material sub-layer. The second low-dielectric constant material sub-layer has at least one different material property than the first low-dielectric constant material sub-layer. A third low-dielectric constant material sub-layer is disposed over the second low-dielectric constant material sub-layer, the third low-dielectric constant material sub-layer having at least one different material property than the second low-dielectric constant material sub-layer. The first, second and third low-dielectric constant materials sub-layers are preferably comprised of the same material, deposited continuously in one or more deposition chambers while the deposition conditions such as the gas flow rate, power, or gas species are adjusted or changed.

59 Claims, 3 Drawing Sheets

INTEGRATION FILM SCHEME FOR COPPER / LOW-K INTERCONNECT

CROSS-REFERENCE TO RELATED APPLICATIONS

This application relates to the following and commonly assigned patent application: Ser. No. 10/602,751, filed on Jun. 24, 2003, entitled Hybrid Copper/Low k Dielectric Interconnect Integration Method and Device, which application is hereby incorporated herein by reference.

TECHNICAL FIELD

The present invention relates generally semiconductor devices, and more particularly to semiconductor devices having multiple layers of metallization.

BACKGROUND

As semiconductor device circuit density increases and device feature size decreases, increased numbers of patterned metal levels are required with decreased spacing between metal lines at each level to effectively interconnect discrete semiconductor devices on semiconductor chips. The different levels of metal interconnections are separated by layers of insulating materials or films, often referred to as inter-level dielectric (ILD) layers. These interposed insulating layers have etched holes or trenches that are filled with a conductive material, referred to as vias or plugs, which are used to connect one level of metallization lines to the next. A common insulating material used for ILD layers is silicon oxide ($SiO_2$), which has a dielectric constant (k) of about 4.0 to 4.5, relative to a vacuum, which has a k value of 1.0.

However, as semiconductor device dimensions decrease and the packing density increases, it is necessary to reduce the spacing between the metal lines at each level of interconnection to wire up the integrated circuits. Unfortunately, as the spacing decreases, the intra-level and inter-level capacitances increase between metal lines, as capacitance is inversely proportional to the spacing between the lines. Therefore, it is desirable to minimize the dielectric constant k of the insulating material (dielectric) between the conducting lines, in order to reduce the RC time constant and thereby increase the performance of the circuit, e.g., the frequency response, since the signal propagation time in the circuit is adversely affected by the RC delay time.

To achieve an insulating layer with a dielectric constant of 3 or less, low-k insulating films are often used for ILD layers. However, lower-k dielectric materials usually have poor mechanical strength and related properties. In general, the lower the k value, the poorer the mechanical strength. Introducing low-k insulating materials into a multi-level metallization integration scheme results in a mechanically weak and vulnerable low-k interconnect stack, degrading the reliability of the semiconductor device and resulting in device failures.

SUMMARY OF THE INVENTION

These and other problems are generally solved or circumvented, and technical advantages are generally achieved, by preferred embodiments of the present invention, which provide a novel integration scheme for multi-layer metallization using low-dielectric constant materials. A single ILD layer includes three or more sub-layers of low-dielectric constant material, wherein adjacent sub-layers have different properties. The single ILD layer may comprise one type of low-dielectric constant material, wherein parameters are changed during deposition to achieve the different properties of the three or more sub-layers of low-dielectric constant material. Adjacent sub-layers of the ILD layer may have different dielectric constants, densities, Young's modulus, and adhesion properties, as examples.

In accordance with a preferred embodiment of the present invention, a method of manufacturing an inter-level dielectric (ILD) layer of a semiconductor device includes forming a first low-dielectric constant material sub-layer over the substrate, the first low-dielectric constant material having at least one first material property, and forming a second low-dielectric constant material sub-layer over the first low-dielectric constant material sub-layer, the second low-dielectric constant material sub-layer having at least one second material property, wherein the at least one second material property is different from the at least one first material property. The method includes forming a third low-dielectric constant material sub-layer over the second low-dielectric constant material sub-layer, the third low-dielectric constant material sub-layer having at least one third material property, the at least one third material property being different from the at least one second material property.

In accordance with another preferred embodiment of the present invention, a method of manufacturing a semiconductor device includes providing a substrate, the substrate having component regions formed thereon, forming a first etch stop layer over the substrate, and forming a first ILD layer over the first etch stop layer. At least one first conductive region is formed in the first ILD layer and first etch stop layer, wherein at least one first conductive region makes electrical contact with at least one component region of the substrate. Forming the first ILD layer comprises forming a first low-dielectric constant material sub-layer over the first etch stop layer, and forming a second low-dielectric constant material sub-layer over the first low-dielectric constant material sub-layer, the second low-dielectric constant material sub-layer having at least one different material property than the first low-dielectric constant material sub-layer. Forming the ILD layer includes forming a third low-dielectric constant material sub-layer over the second low-dielectric constant material sub-layer, the third low-dielectric constant material sub-layer having at least one different material property than the second low-dielectric constant material sub-layer.

In accordance with yet another preferred embodiment of the present invention, an ILD layer of a semiconductor device includes a first low-dielectric constant material sub-layer, the first low-dielectric constant material having at least one first material property, and a second low-dielectric constant material sub-layer disposed over the first low-dielectric constant material sub-layer, the second low-dielectric constant material sub-layer having at least one second material property, wherein the at least one second material property is different from the at least one first material property. The ILD layer includes a third low-dielectric constant material sub-layer disposed over the second low-dielectric constant material sub-layer, the third low-dielectric constant material sub-layer having at least one third material property, the at least one third material property being different from the at least one second material property.

In accordance with another preferred embodiment of the present invention, a semiconductor device includes a substrate, the substrate having component regions formed thereon, a first etch stop layer disposed over the substrate, and a first ILD layer disposed over the first etch stop layer. At least one first conductive region is formed in the first ILD layer and first etch stop layer, wherein at least one first conductive region makes electrical contact with at least one component region of the substrate. The first ILD layer includes a first low-dielectric constant material sub-layer disposed over the first etch stop layer, and a second low-dielectric constant material sub-layer disposed over the first low-dielectric constant material sub-layer, the second low-dielectric constant material sub-layer having at least one different material property than the first low-dielectric constant material sub-layer. A third low-dielectric constant material sub-layer is disposed over the second low-dielectric constant material sub-layer, the third low-dielectric constant material sub-layer having at least one different material property than the second low-dielectric constant material sub-layer.

Advantages of preferred embodiments of the present invention include providing a multi-layer metallization structure and method of manufacturing thereof wherein the ILD layers comprise low-dielectric constant materials, yet have increased mechanical strength. Semiconductor devices utilizing the novel metallization ILD scheme described herein have improved reliability and increased yields.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of embodiments of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
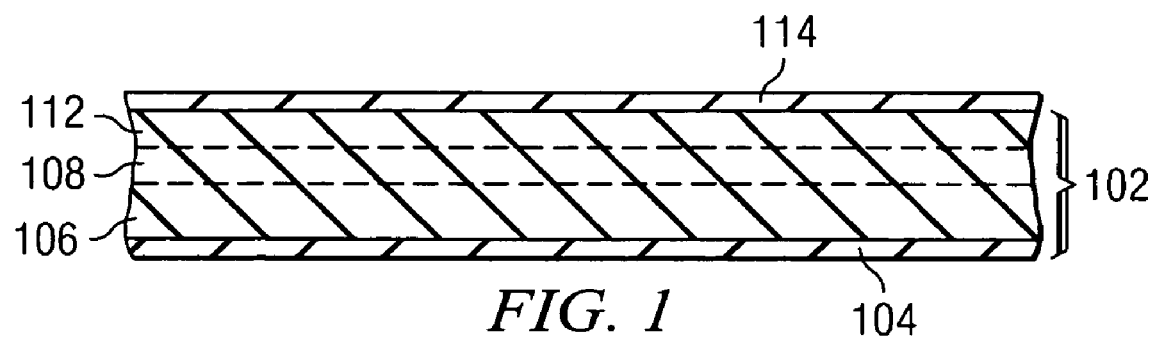
FIG. 1 shows a cross-sectional view of an ILD layer having three or more sub-layers in accordance with an embodiment of the present invention.

With reference to FIG. 1, a cross-sectional view of an ILD layer 102 manufactured in accordance with a preferred embodiment of the present invention is shown. The ILD layer 102 includes an etch stop layer (ESL) 104. The etch stop layer 104 may comprise SiC, SiCO, SiCN, combinations thereof, or other insulating materials, as examples, deposited using CVD or PECVD to a thickness of 200 to 1,000 Angstroms, as examples. The etch stop layer 104 protects an underlying insulating layer (not shown in FIG. 1; see FIG. 3) during the patterning or etching of the ILD layer 102, and also provides improved adhesion for subsequently formed low-dielectric constant material sub-layers 106, 108 and 112.

The ILD layer 102 includes three or more low-dielectric constant material sub-layers 106, 108, and 112 in accordance with an embodiment of the present invention. The ILD layer 102 includes a first low-dielectric constant material sub-layer 106 disposed over the etch stop layer 104. A second low-dielectric constant material sub-layer 108 is disposed over the first low-dielectric constant material sub-layer 106, and at least a third low-dielectric constant material sub-layer 112 is disposed over the second low-dielectric constant material sub-layer 108. The ILD layer 102 may include additional low-dielectric constant material sub-layers, not shown.

An etch stop layer 114 may be deposited over the ILD layer 102. The top etch stop layer 114 protects the ILD layer 102 during etch processes and improves adhesion of subsequently-deposited ILD layers, not shown (see FIG. 3). The etch stop layer 114 may be deposited either before or after the patterning of the ILD layer 102.

Figure 3:
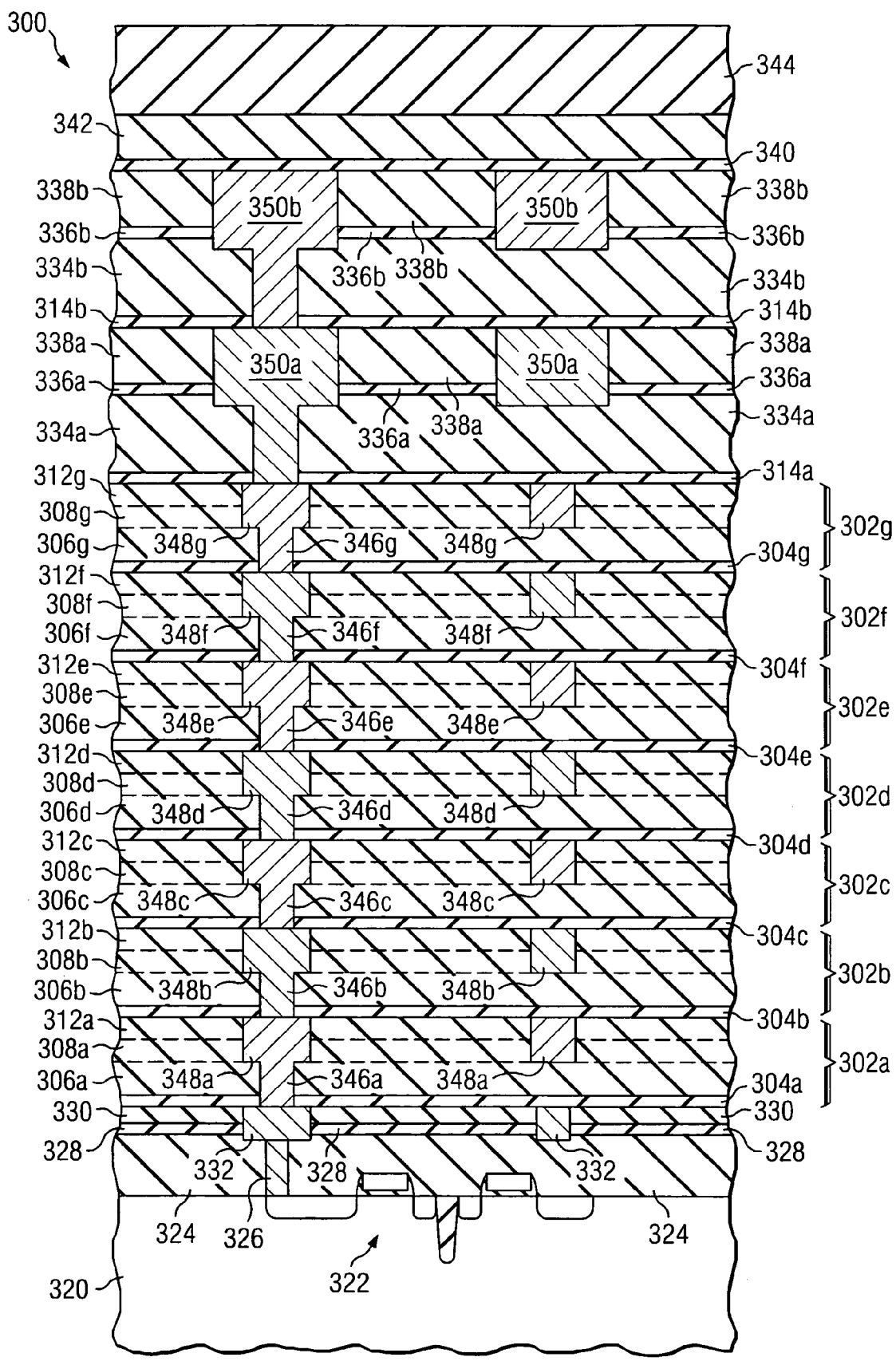
FIG. 3 illustrates a cross-sectional view of a semiconductor device having many ILD layers manufactured in accordance with a preferred embodiment of the present invention.

Contact openings may be formed in the etch stop layer 114 and ILD 102 and may be filled with a conductive material (not shown in FIG. 1; see FIG. 3). The contact opening may be filled with a conductive plug comprising tungsten, aluminum, doped polysilicon, or some other appropriate conductive material. The plug may include adhesion and barrier layers, such as titanium and titanium nitride, respectively, for improved device characteristics. Alternatively, a single or dual damascene process may be employed to form trenches and holes in the ILD layer 102 for conductive lines and/or vias, followed by filling, growing or depositing a conductive material such as copper within the trenches and holes to form the conductive lines and vias.

Preferably, each low-dielectric constant material sub-layer 106, 108, and 112 has at least one different material property than an adjacent low-dielectric constant material sub-layer 106, 108, and 112. For example, they may have different low-dielectric constants (k) and/or densities and may comprise different low-k materials altogether. In one embodiment, the lowest level low-dielectric constant material sub-layer 106 (the sub-layer adjacent the bottom etch stop layer 104) comprises a lower dielectric constant k than the dielectric constant of the other upper sub-layers 108 and 112. For example, first low-dielectric constant material sub-layer 106 may comprise a dielectric constant of below about 2.8, e.g., ranging from about 2.2 to 2.5, and the second low-dielectric constant material 108 and third low-dielectric constant material 112 may comprise dielectric constants of about 2.8 or greater, e.g., about 2.8 to 3.3. As another example, the first low-dielectric constant material sub-layer 106 may comprise a density of about 0.89 to 1.2, and the second low-dielectric constant material sub-layer 108 and third low-dielectric constant material sub-layer 108 may comprise a density of between about 1.2 to 1.8.

In another embodiment, the Young's modulus of the first low-dielectric constant material sub-layer 106 may be smaller than the Young's modulus of the second and third low-dielectric constant materials 108 and 112. For example, the Young's modulus of the first low-dielectric constant material sub-layer 106 may be about 20 GPa and the Young's modulus of the second and third low-dielectric constant materials 108 and 112 may be about 10 GPa or smaller. As another example, the first low-dielectric constant material sub-layer 106 may have a Young's modulus of about 10 GPa or less, the second low-dielectric constant material 108 may have a Young's modulus of about 10–15 GPa, and the third low-dielectric constant material 112 may have a Young's modulus of about 5–10 GPa.

In yet another embodiment, the first low-dielectric constant material sub-layer 106 may be more adhesive than the second and third low-dielectric constant materials 108 and 112, for example. This is advantageous in that adhesion of the first low-dielectric constant material sub-layer 106 to the etch stop layer 104 is improved. The adhesion of the first low-dielectric constant material sub-layer 106 may be greater than about 10 J/m$^2$, and the adhesion of the second and third low-dielectric constant materials 108 and 112 may be less than about 10 J/m$^2$, as examples.

In one embodiment, the low-k material sub-layers 106, 108 and 112 preferably comprise only one single type of material, wherein the deposition conditions are changed or adjusted during a continuous deposition process in one or more deposition chambers while the single type of material is deposited. The changes in the deposition conditions create the different material properties of the low-dielectric material sub-layers 106, 108, and 112. For example, parameters of the deposition process that may be changed include the gas flow rate, power level, or gas species, as examples. Alternatively, other deposition process parameters that may be changed or adjusted to create the different material properties of the low-dielectric constant material sub-layers 106, 108, and 112 include temperature and pressure, as examples. In another embodiment, each low-dielectric material sub-layer 106, 108, and 112 may comprise a different type of low-k material, for example.

The low-k material sub-layers 106, 108, and 112 preferably comprise low-dielectric constant materials such as methyl silsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof, as examples. Alternatively, the low-k material sub-layers 106, 108, and 112 may comprise other low-dielectric constant materials, such as nanoporous silica, xerogel, polytetrafluoroethylene (PTFE), or low-dielectric constant (low-k) materials such as SiLK available from Dow Chemicals of Midland, Mich., Flare, available from Allied Signal of Morristown, N.J., and Black Diamond, available from Applied Materials of Santa Clara, Calif., as examples, although other low-k materials may also be used. The sub-layers 106, 108, and 112 are preferably deposited using a chemical vapor deposition ("CVD") or a spin-on coating technique, although other deposition techniques may alternatively be used. The ILD layer 102 is preferably deposited to a thickness of approximately 2,000 to 9,000 Angstroms, for example, although the ILD layer 102 may comprise other thicknesses. One skilled in the art will recognize that the preferred thickness range will be a matter of design choice and will likely decrease as device critical dimensions shrink and processing controls improve over time.

In a preferred embodiment of the present invention, preferably, the first, second and third low-dielectric constant material sub-layers 106, 108, and 112 comprise low-dielectric MSQ, for example. A substrate (not shown in FIG. 1; see FIG. 3) is placed in a deposition chamber. Deposition chemistries are introduced into the deposition chamber at a first temperature and a first gas flow rate for a period of time to form the first low-dielectric constant material sub-layer 106 having a dielectric constant of about 2.5 and a density of 0.9, as an example. The gas flow rate is changed to a second gas flow rate to form the second low-dielectric constant material sub-layer 108 having a dielectric constant of about 3.0 and a density of about 1.5. The gas flow rate is changed to a third gas flow rate to form the third low-dielectric constant material sub-layer 112 having a dielectric constant of about 3.3 and a density of about 1.7. Alternatively, to achieve the different material properties of the sub-layers 106, 108, and 112, other deposition process parameters may be adjusted, such as the power level, gas species introduced to the deposition chamber, temperature, and/or pressure, or combinations of the various process parameters described herein, as examples.

Figure 2:
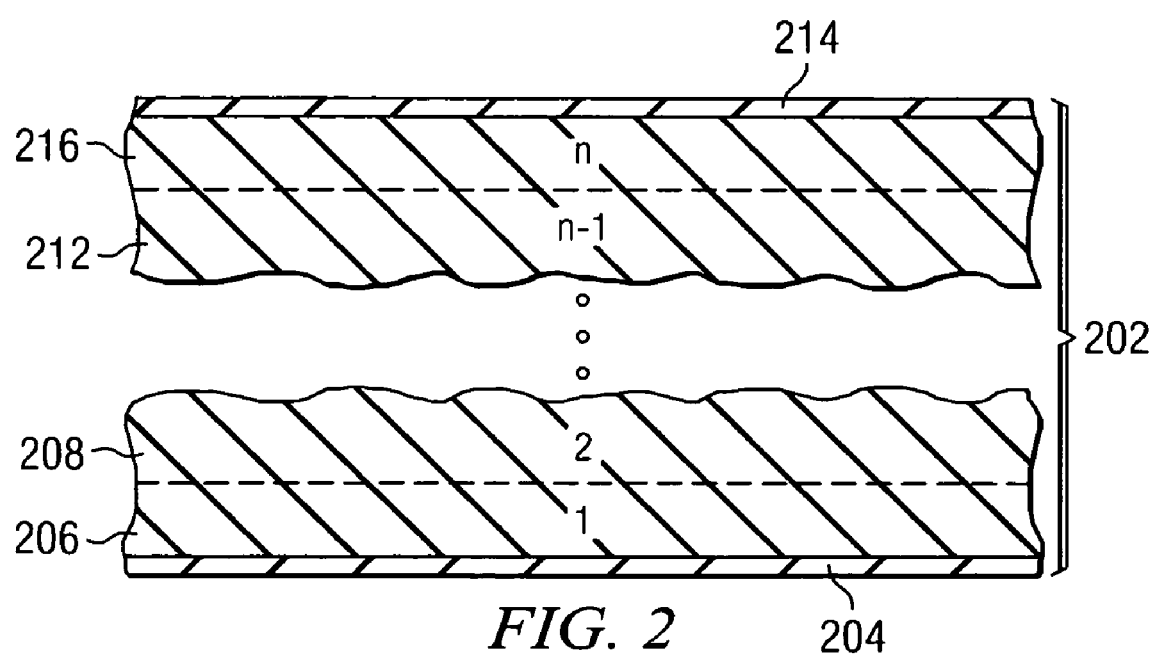
FIG. 2 shows another cross-sectional view of an ILD layer in accordance with a preferred embodiment of the invention.

FIG. 2 shows another cross-sectional view of an ILD layer 202 in accordance with another preferred embodiment of the invention. The ILD layer 202 includes an etch stop layer 204 comprising SiC, SiCO, SiCN, combinations thereof, or other insulating materials, as examples, deposited using CVD or PECVD to a thickness of 200 to 1,000 Angstroms, as examples. The low-dielectric constant material sub-layers 206, 208, 212, and 216 are numbered sequentially: low-dielectric constant material sub-layer 206 is deposited first, indicated by the number 1 in FIG. 2. A first low-dielectric constant material sub-layer 206 is formed over the etch stop layer 204. One or more parameters of the deposition process is modified or adjusted to form a second low-dielectric constant material sub-layer 208 (layer number 2) disposed over and abutting the first low-dielectric constant material sub-layer 206. The second low-dielectric constant material sub-layer 208 may comprise the same material having one or more different material parameters, such as density, dielectric constant, adhesion, and Young's modulus, as examples, than the first low-dielectric constant material sub-layer 206 in one embodiment. Alternatively, the second low-dielectric constant material sub-layer 208 may comprise a different material than the first low-dielectric constant material sub-layer 206.

One or more parameters of the deposition process is modified or adjusted to form a third low-dielectric constant material sub-layer 212 (layer number (n−1)) disposed over and abutting the second low-dielectric constant material sub-layer 208. The third low-dielectric constant material sub-layer 212 comprises the same material having at least one different parameter, such as density, dielectric constant, adhesion, and Young's modulus, as examples, than the second low-dielectric constant material sub-layer 208 in one embodiment. Alternatively, the third low-dielectric constant material sub-layer 212 may comprise a different material than the second low-dielectric constant material sub-layer 208.

One or more parameters of the deposition process is modified or adjusted to form a fourth low-dielectric constant material sub-layer 216 (layer number n) over and abutting the third low-dielectric constant material sub-layer 212. The fourth low-dielectric constant material sub-layer 216 comprises the same material having at least one different parameter, such as density, dielectric constant, adhesion, and Young's modulus, as examples, than the third low-dielectric constant material sub-layer 212 in one embodiment. Alternatively, the fourth low-dielectric constant material sub-layer 216 may comprise a different material than the third low-dielectric constant material sub-layer 212.

The total number of sub-layers n of the ILD layer 202 preferably comprises three or more, and may comprise five or more in one embodiment, for example. An etch stop layer 214 may be deposited over the top low dielectric constant material 216, before or after patterning the ILD layer 202, as shown.

FIG. 3 illustrates a cross-sectional view of a semiconductor device 300 having many ILD layers 302 (shown as 302a through 302g), as described herein with reference to ILD layer 102 of FIG. 1 and ILD layer 202 of FIG. 2, manufactured in accordance with a preferred embodiment of the present invention. FIG. 3 illustrates a portion of an integrated circuit embodying aspects of the present invention. In particular, device 300 includes a substrate 320 comprising a single semiconductor wafer, such as a single crystal silicon wafer. Alternatively, the substrate 300 may comprise a thin silicon layer formed over a buried oxide, such as a silicon-on-insulator (SOI) substrate, or other semiconductor materials, as examples. A component region 322 is formed in the substrate 300. The component region 322 may comprise a first transistor and a second transistor, separated by an isolation region, as shown, although the component region 322 may alternatively comprise other elements or circuits, for example. There may be many component regions 322 formed in the substrate (not shown). The details regarding the formation of the component regions 322 are omitted because they are not necessary for an understanding of the invention.

The semiconductor device 300 includes a stack of ten or more metallization layers disposed over the component region 322, as shown. The metallization layers connect the component region 322 to other transistors and devices (not shown) on the integrated circuit, including ground nodes and voltage nodes. The metallization layers also connect the various component regions 322 of the integrated circuit to circuitry, signals, and voltages external to the integrated circuit device.

A dielectric layer 324 overlies and electrically insulates the component regions 322 formed within or on the substrate 320 from subsequently formed layers, such as metal layer 332. Electrical contact to the component regions 322 formed within or on the substrate 320 is accomplished by way of contacts 326 through an etch stop layer 328 and dielectric layer 324. In the illustrated embodiment, only one contact is shown connecting to a doped region of a transistor of the component region 322, for clarity. One skilled in the art will recognize that multiple contacts may be made to the component regions 322, including connection to other doped regions and to the gates of the component region 322, although these have been omitted from the drawings for clarity. A first metal pattern 332 is formed above the component region 322 and is electrically coupled to the component region 322 via contacts 326. This first metal pattern 332 is electrically insulated from other conductive components by dielectric layer 330, etch stop layer 328, and by dielectric layer 324. The dielectric layers 330 and 324 may comprise silicon dioxide, undoped silicon glass (USG) or low-k materials, for example.

An etch stop layer 304a is deposited over the dielectric layer 330, as described herein with reference to etch stop layer 104 in FIG. 1 and 204 in FIG. 2. Three or more low-dielectric constant material sub-layers 306a, 308a, and 312a are formed sequentially over the etch stop layer 304a, as shown, also as described with reference to low-dielectric constant material sub-layers 106, 108, and 112 in FIG. 1 and low-dielectric constant material sub-layers 206, 208, and 212 in FIG. 2. Adjacent low-dielectric constant material sub-layers 306a and 308a preferably comprise at least one material property difference. Similarly, adjacent low-dielectric constant material sub-layers 308a and 312a preferably comprise at least one material property difference. The sub-layers 306a, 308a, and 312a preferably comprise the same material deposited continuously in one or more deposition chambers, in one embodiment.

The low-k material sub-layers 306a, 308a, and 312a are patterned using lithography techniques with a pattern for the desired metallization layers and vias. For example, in a dual damascene process, vias 346a may be patterned, followed by the patterning of conductive lines 348a. Alternatively, the conductive lines 348a may be patterned before the vias 346a are patterned. The plurality of low-k material sub-layers 306a, 308a, and 312a are preferably patterned as a single layer. A conductive material such as copper is deposited over the patterned low-k material sub-layers 306a, 308a, and 312a, and excess conductive material is removed from the top surface of the top low-k material sub-layer 312a, using a chemical-mechanical polish (CMP) process, for example, forming conductive lines 348a and vias 346a that make electrical contact to conductive line 332, as shown. Conductive lines 348a and vias 346a form a single metallization layer of the semiconductor device 300. Barrier liners and seed layers may be deposited before filling the patterned low-k material sub-layers 306a, 308a, and 312a with conductive material, for example, not shown.

The process is repeated to form a plurality of additional metallization layers, as described herein and with reference to ILD layers 302b, 302c, 302d, 302e, 302f, and 302g and etch stop layers 304c, 304d, 304e, 304f, and 304g. While seven layers of ILD layers are shown in FIG. 3, there may be more, or fewer ILD layers formed from three or more low-k material sub-layers 306, 308, and 312 (shown in FIG. 3 as 306a–306g, 308a–308g, and 312a–312g) on the semiconductor device 300.

Note that the etch stop layer 304b may be deposited over the top low-k material sub-layer 312a either prior to, or after, the patterning of the low-k material sub-layers 312a, 308a, and 306a. If the etch stop layer 304b is deposited over the low-k material sub-layer 312 prior to the patterning of the low-k material sub-layers 312a, 308a, and 306a, the etch stop layer 304b must be patterned in addition to the patterning of the low-k material sub-layers 312a, 308a, and 306a so that electrical contact will be made from vias 346a–346g to 332 and 348a–348f, respectively. The etch stop layer 304b protects the top low-dielectric constant material sub-layer 312a during the CMP process to remove excess conductive material.

Processing of the semiconductor device 300 is then continued to complete the device. For example, an etch stop layer 314a may be deposited over the top ILD layer 302g, and a dielectric layer 334a may be deposited over the etch stop layer 314a. The dielectric layer 334a may be patterned with a via to connect to conductive line 348g, and a conductive material may be deposited to fill the via pattern. Another etch stop layer 336a may be deposited over the dielectric layer 334a, and another dielectric layer 338a may be deposited over the etch stop layer 336a. Conductive lines 350a may be formed in the dielectric layer 338a and etch stop layer 336a by patterning the dielectric layer 338a and etch stop layer 336a and depositing a conductive material. Additional dielectric layers 334b and 338b and etch stop layers 314b and 336b may be similarly deposited, patterned and filled to form vias and conductive lines 350b in single damascene processes, as required. Additional etch stop layer 340 and insulating layers 342 and 344 may be deposited over the dielectric layer 338b and conductive lines 350b, as shown.

Dielectric layers 334a, 338a, 334b, and 338b (being the top several dielectric layers in which are formed metal patterns 350a and 350b, respectively) are preferably formed of a material having a dielectric constant in the range of about 3.0 to 4.2, in one embodiment. One exemplary such material is undoped silicon glass (USG) that may be spun onto the substrate surface and subsequently patterned. In other instances, FSG or other well-known alternatives, having acceptably low-k characteristics, may alternatively be used. While the layer thickness is a matter of design choice and process control, the upper layers are preferably deposited to a thickness in the range of from about 6,000 to 15,000 Angstroms.

Figure 4A:
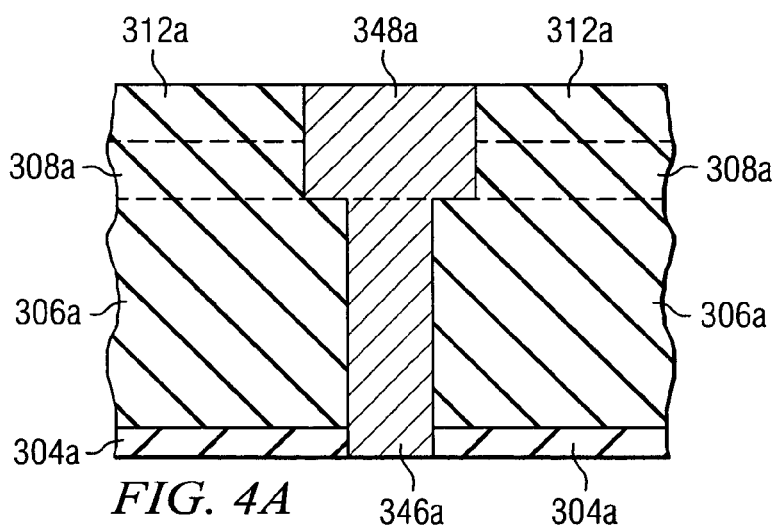
FIGS. 4A through 4C show alternative embodiments of the present invention in a cross-sectional view.
Figure 4B:
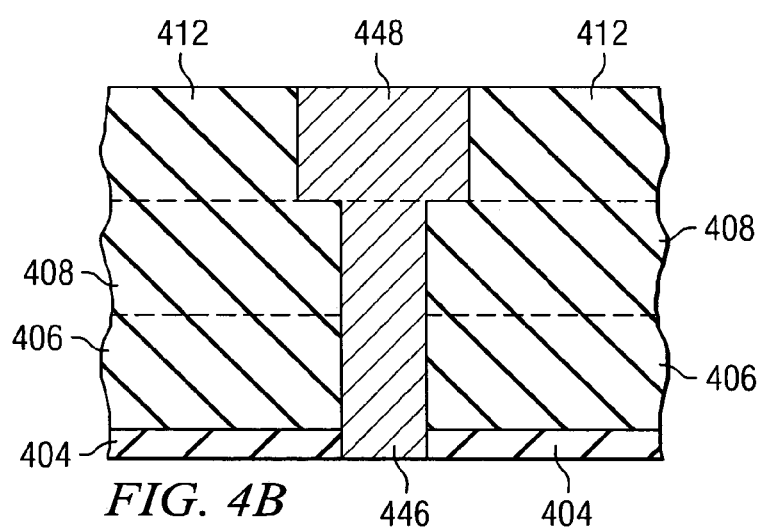
Figure 4C:
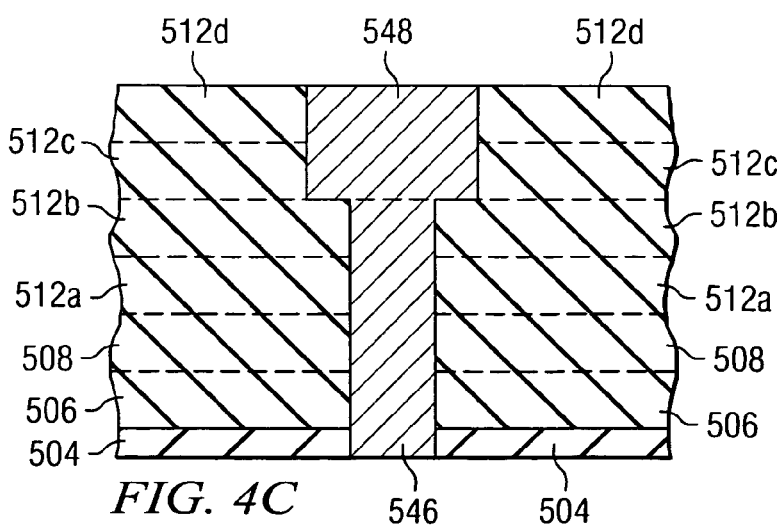

FIGS. 4A through 4C show cross-sectional views of alternative embodiments of the present invention. In one embodiment, vias 346a are formed in the first low-k material sub-layer 306a and the etch stop layer 304a, and conductive lines 348a are formed in the second low-k material sub-layer 308a and the third low-k material sub-layer 312a, as shown in FIGS. 3 and 4A. In another embodiment, vias 446 are formed in an etch stop layer 404, a first low-k material sub-layer 406, and a second low-k material sub-layer 408, and conductive lines 448 are formed in a third low-k material sub-layer 412, as shown in FIG. 4B. In yet another embodiment, vias 546 are formed in an etch stop layer 504, a first low-k material sub-layer 506, a second low-k material sub-layer 508, a third low-k material sub-layer 512a, and a fourth low-k material sub-layer 512b, and conductive lines 548 are formed in a fifth low-k material sub-layer 512c and a sixth low-k material sub-layer 512d, as shown in FIG. 4C. Similarly, vias may be formed in one or more low-k material sub-layers, and conductive lines may be formed in one or more low-k material sub-layers in accordance with embodiments of the present invention.

Advantages of embodiments of the invention include providing a novel multi-level interconnect scheme for semiconductor devices that provides a low-dielectric constant ILD layer with optimum material properties to reduce the RC time delay in multi-level metallization structures. More robust multi-level inter-connect layers result from the method of manufacturing described herein, having improved structural strength. Embodiments of the present invention result in increased yields and improved reliability.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing an inter-level dielectric (ILD) layer of a semiconductor device, the method comprising:

forming an etch-stop layer over a substrate;

forming a first low-dielectric constant material sub-layer over the substrate, the first law-dielectric constant material having at least one first material property, and having a dielectric constant less than that of $SiO_2$;

forming a second low-dielectric constant material sub-layer over the first low-dielectric constant material sub-layer, the second low-dielectric constant material sub-layer having at least one second material property, wherein the at least one second material property is different from the at least one first material property; and forming a third low-dielectric constant material sub-layer over the second low-dielectric constant material sub-layer, the third low-dielectric constant material sub-layer having a dielectric constant less than that of $SiO_2$, and having at least one third material property, the at least one third material property being different from the at least one second material property, wherein the first low-dielectric constant material sub-layer, the second low-dielectric constant material sub-layer, and the third low-dielectric constant material sub-layer form a single ILD layer.

2. The method according to claim 1, wherein manufacturing the ILD layer comprises forming the first low-dielectric constant material sub-layer, second low-dielectric constant material sub-layer, and third low-dielectric constant material sub-layer from methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

3. The method according to claim 1, wherein manufacturing the ILD layer comprises forming the first low-dielectric constant material sub-layer, second low-dielectric constant material sub-layer, and third low-dielectric constant material sub-layer continuously from the same material in one or more deposition chambers.

4. The method according to claim 1, wherein manufacturing the ILD layer comprises forming the first low-dielectric constant material sub-layer, second low-dielectric constant material sub-layer, and third low-dielectric constant material sub-layer while adjusting the deposition conditions.

5. The method according to claim 4, wherein adjusting the deposition conditions comprises adjusting the gas flow rate, power, or gas species.

6. The method according to claim 1, wherein the first material property, second material property, and third material property comprise density, dielectric constant, adhesion, or Young's modulus.

7. The method according to claim 1, further comprising forming at least one fourth low-dielectric constant material sub-layer over the third low-dielectric constant material sub-layer, the fourth low-dielectric constant material sub-layer having at least one fourth material property, wherein the at least one fourth material property is different from the at least one third material property.

8. A method of manufacturing a semiconductor device, the method comprising:
   providing a substrate, the substrate having component regions formed thereon;
   forming a first etch stop layer over the substrate;
   forming a first inter-level dielectric (ILD) layer over the first etch stop layer; and
   forming at least one first conductive region in the first ILD layer and first etch stop layer, wherein at least one first conductive region makes electrical contact with at least one component region of the substrate, and wherein the first ILD layer comprises a single ILD layer and forming the first ILD layer comprises:
      forming a first low-dielectric constant material sub-layer over the first etch stop layer;
      forming a second low-dielectric constant material sub-layer over the first low-dielectric constant material sub-layer, the second low-dielectric constant material sub-layer having at least one different material property than the first low-dielectric constant material sub-layer; and
      forming a third low-dielectric constant material sub-layer over the second low-dielectric constant material sub-layer, the third low-dielectric constant material sub-layer having at least one different material property than the second low-dielectric constant material sub-layer.

9. The method according to claim 8, wherein forming the first ILD layer comprises forming the first low-dielectric constant material sub-layer, second low-dielectric constant material sub-layer, and third low-dielectric constant material sub-layer from methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

10. The method according to claim 8, wherein forming the first ILD layer comprises forming the first low-dielectric constant material sub-layer, second low-dielectric constant material sub-layer, and third low-dielectric constant material sub-layer continuously from the same material in one or more deposition chambers.

11. The method according to claim 8, wherein forming the first ILD layer comprises forming the first low-dielectric constant material sub-layer, second low-dielectric constant material sub-layer, and third low-dielectric constant material sub-layer while adjusting the deposition conditions.

12. The method according to claim 11, wherein adjusting the deposition conditions comprises adjusting the gas flow rate, power, or gas species.

13. The method according to claim 8, wherein the material property of the second low-dielectric constant material sub-layer and the material property of the third low-dielectric constant material sub-layer comprise density, dielectric constant, adhesion, or Young's modulus.

14. The method according to claim 8, further comprising forming at least one fourth low-dielectric constant material sub-layer over the third low-dielectric constant material sub-layer, the fourth low-dielectric constant material sub-layer having at least one different material property than the third low-dielectric constant material sub-layer.

15. The method according to claim 8, further comprising:
   forming a second etch stop layer over the first ILD layer;
   forming a second ILD layer over the second etch stop layer; and
   forming at least one second conductive region in the second ILD layer and second etch stop layer, wherein the at least one second conductive region makes electrical contact with the at least one first conductive region, and wherein forming the second ILD layer comprises:
      forming a fourth low-dielectric constant material sub-layer over the second etch stop layer;
      forming a fifth low-dielectric constant material sub-layer over the fourth low-dielectric constant material sub-layer, the fifth low-dielectric constant material sub-layer having at least one different material property than the fourth low-dielectric constant material sub-layer; and
      forming a sixth low-dielectric constant material sub-layer over the fifth low-dielectric constant material sub-layer, the sixth low-dielectric constant material sub-layer having at least one different material property than the fifth low-dielectric constant material sub-layer.

16. An inter-level dielectric (ILD) layer of a semiconductor device, comprising:
   a first low-dielectric constant material sub-layer over an etch-stop layer, the first low-dielectric constant material having at least one first material property;
   a second low-dielectric constant material sub-layer disposed over the first low-dielectric constant material sub-layer, the second low-dielectric constant material sub-layer having at least one second material property, wherein the at least one second material property is different from the at least one first material property; and
   a third low-dielectric constant material sub-layer disposed over the second low-dielectric constant material sub-layer, the third low-dielectric constant material sub-layer having at least one third material property, the at least one third material property being different from the at least one second material property, wherein the first low-dielectric constant material sub-layer, the second low-dielectric constant material sub-layer, and the third low-dielectric constant material sub-layer form a single ILD layer.

17. The ILD layer according to claim 16, wherein the first low-dielectric constant material sub-layer, second low-dielectric constant material sub-layer, and third low-dielectric constant material sub-layer comprise methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

18. The ILD layer according to claim 16, wherein the first low-dielectric constant material sub-layer, second low-dielectric constant material sub-layer, and third low-dielectric constant material sub-layer are formed continuously from the same material in one or more deposition chambers.

19. The ILD layer according to claim 16, wherein the first material property, second material property, and third material property comprise density, dielectric constant, adhesion, or Young's modulus.

20. The ILD layer according to claim 16, further comprising at least one fourth low-dielectric constant material sub-layer disposed over the third low-dielectric constant material sub-layer, the fourth low-dielectric constant material sub-layer having at least one fourth material property, wherein the at least one fourth material property is different from the at least one third material property.

21. A semiconductor device, comprising:
a substrate, the substrate having component regions formed thereon;
a first etch stop layer disposed over the substrate;
a first inter-level dielectric (ILD) layer disposed over the first etch stop layer; and
at least one first conductive region formed in the first ILD layer and first etch stop layer, wherein the at least one first conductive region makes electrical contact with at least one component region of the substrate, and wherein the first ILD layer is a single ILD layer comprising:
   a first low-dielectric constant material sub-layer disposed over the first etch stop layer;
   a second low-dielectric constant material sub-layer disposed over the first low-dielectric constant material sub-layer, the second low-dielectric constant material sub-layer having at least one different material property than the first law-dielectric constant material sub-layer; and
   a third low-dielectric constant material sub-layer disposed over the second low-dielectric constant material sub-layer, the third low-dielectric constant material sub-layer having at least one different material property than the second low-dielectric constant material sub-layer.

22. The semiconductor device according to claim 21, wherein the first low-dielectric constant material sub-layer, second low-dielectric constant material sub-layer, and third low-dielectric constant material sub-layer comprise methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

23. The semiconductor device according to claim 21, wherein the first low-dielectric constant material sub-layer, second low-dielectric constant material sub-layer, and third low-dielectric constant material sub-layer are formed continuously from the same material in one or more deposition chambers.

24. The semiconductor device according to claim 21, wherein the different material property of the second low-dielectric constant material sub-layer and third low-dielectric constant material sub-layer comprises density, dielectric constant, adhesion, or Young's modulus.

25. The semiconductor device according to claim 21, further comprising at least one fourth low-dielectric constant material sub-layer disposed over the third low-dielectric constant material sub-layer, the fourth low-dielectric constant material sub-layer having at least one different material property than the third low-dielectric constant material sub-layer.

26. The semiconductor device according to claim 21, further comprising;
a second etch stop layer disposed over the first ILD layer;
a second ILD layer disposed over the second etch stop layer; and
at least one second conductive region disposed in the second ILD layer and second etch stop layer, wherein the at least one second conductive region makes electrical contact with the at least one first conductive region, and wherein the first ILD layer comprises:
   a fourth low-dielectric constant material sub-layer disposed over the second etch stop layer;
   a fifth low-dielectric constant material sub-layer disposed over the fourth low-dielectric constant material sub-layer, the fifth low-dielectric constant material sub-layer having at least one different material property than the fourth low-dielectric constant material sub-layer; and
   forming a sixth low-dielectric constant material sub-layer over the fifth low-dielectric constant material sub-layer, the sixth low-dielectric constant material sub-layer having at least one different material property than the fifth low-dielectric constant material sub-layer.

27. The semiconductor device according to claim 21, wherein the first low-dielectric constant material sub-layer comprises a first Young's modulus, wherein the first Young's modulus is greater than a second Young's modulus of the second low-dielectric constant material sub-layer and a third Young's modulus of the third low-dielectric constant material sub-layer.

28. The semiconductor device according to claim 21, wherein the first low-dielectric constant material sub-layer comprises a first dielectric constant, wherein the first dielectric constant is less than a second dielectric constant of the second low-dielectric constant material sub-layer and a third dielectric constant of the third low-dielectric constant material sub-layer.

29. The semiconductor device according to claim 21, wherein the first low-dielectric constant material sub-layer is more adhesive than the second low-dielectric constant material sub-layer and the third low-dielectric constant material sub-layer.

30. A method of manufacturing an inter-level dielectric (ILD) layer of a semiconductor device, the method comprising:
forming a first low-dielectric constant material sub-layer over a substrate, the first low-dielectric constant material having at least one first material property;
forming a second low-dielectric constant material sub-layer over the first low-dielectric constant material sub-layer, the second low-dielectric constant material sub-layer having at least one second material property, wherein the at least one second material property is different from the at least one first material property; and
forming a third low-dielectric constant material sub-layer over the second low-dielectric constant material sub-layer, the third low-dielectric constant material sub-layer having at least one third material property, the at least one third material property being different from the at least one second material property, wherein the first low-dielectric constant material sub-layer, the second low-dielectric constant material sub-layer, and the third low-dielectric constant material sub-layer form a single ILD layer;

wherein manufacturing the ILD layer comprises forming the first low-dielectric constant material sub-layer, second low-dielectric constant material sub-layer, and third low-dielectric constant material sub-layer from methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

31. The method according to claim 30, wherein manufacturing the ILD layer comprises forming the first low-dielectric constant material sub-layer, second low-dielectric constant material sub-layer, and third low-dielectric constant material sub-layer continuously from the same material in one or more deposition chambers.

32. The method according to claim 30, wherein manufacturing the ILD layer comprises forming the first low-dielectric constant material sub-layer, second low-dielectric constant material sub-layer, and third low-dielectric constant material sub-layer while adjusting deposition conditions.

33. The method according to claim 32, wherein adjusting the deposition conditions comprises adjusting the gas flow rate, power, or gas species.

34. The method according to claim 30, wherein the first material property, second material property, and third material property comprise density, dielectric constant, adhesion, or Young's modulus.

35. The method according to claim 30, further comprising forming at least one fourth low-dielectric constant material sub-layer over the third low-dielectric constant material sub-layer, the fourth low-dielectric constant material sub-layer having at least one fourth material property, wherein the at least one fourth material property is different from the at least one third material property.

36. A method of manufacturing an inter-level dielectric (ILD) layer of a semiconductor device, the method comprising:
forming a first low-dielectric constant material sub-layer over a substrate, the first low-dielectric constant material having at least one first material property;
forming a second low-dielectric constant material sub-layer over the first low-dielectric constant material sub-layer, the second low-dielectric constant material sub-layer having at least one second material property, wherein the at least one second material property is different from the at least one first material property; and
forming a third low-dielectric constant material sub-layer over the second low-dielectric constant material sub-layer, the third low-dielectric constant material sub-layer having at least one third material property, the at least one third material property being different from the at least one second material property, wherein the first low-dielectric constant material sub-layer, the second low-dielectric constant material sub-layer, and the third low-dielectric constant material sub-layer form a single ILD layer;
wherein manufacturing the ILD layer comprises forming the first low-dielectric constant material sub-layer, second low-dielectric constant material sub-layer, and third low-dielectric constant material sub-layer continuously from the same material in one or more deposition chambers.

37. The method according to claim 36, wherein manufacturing the ILD layer comprises forming the first low-dielectric constant material sub-layer, second low-dielectric constant material sub-layer, and third low-dielectric constant material sub-layer from methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

38. The method according to claim 36, wherein manufacturing the ILD layer comprises forming the first low-dielectric constant material sub-layer, second low-dielectric constant material sub-layer, and third low-dielectric constant material sub-layer while adjusting deposition conditions.

39. The method according to claim 38, wherein adjusting the deposition conditions comprises adjusting the gas flow rate, power, or gas species.

40. The method according to claim 36, wherein the first material property, second material property, and third material property comprise density, dielectric constant, adhesion, or Young's modulus.

41. The method according to claim 36, further comprising forming at least one fourth low-dielectric constant material sub-layer over the third low-dielectric constant material sub-layer, the fourth low-dielectric constant material sub-layer having at least one fourth material property, wherein the at least one fourth material property is different from the at least one third material property.

42. A method of manufacturing an inter-level dielectric (ILD) layer of a semiconductor device, the method comprising:
forming a first low-dielectric constant material sub-layer over a substrate, the first low-dielectric constant material having at least one first material property;
forming a second low-dielectric constant material sub-layer over the first low-dielectric constant material sub-layer, the second low-dielectric constant material sub-layer having at least one second material property, wherein the at least one second material property is different from the at least one first material property;
forming a third low-dielectric constant material sub-layer over the second low-dielectric constant material sub-layer, the third low-dielectric constant material sub-layer having at least one third material property, the at least one third material property being different from the at least one second material property, wherein the first low-dielectric constant material sub-layer, the second low-dielectric constant material sub-layer, and the third low-dielectric constant material sub-layer form a single ILD layer; and
forming at least one fourth low-dielectric constant material sub-layer over the third low-dielectric constant material sub-layer, the fourth low-dielectric constant material sub-layer having at least one fourth material property, wherein the at least one fourth material property is different from the at least one third material property.

43. The method according to claim 42, wherein manufacturing the ILD layer comprises forming the first low-dielectric constant material sub-layer, second low-dielectric constant material sub-layer, and third low-dielectric constant material sub-layer from methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

44. The method according to claim 42, wherein manufacturing the ILD layer comprises forming the first low-dielectric constant material sub-layer, second low-dielectric constant material sub-layer, and third low-dielectric constant material sub-layer continuously from the same material in one or more deposition chambers.

45. The method according to claim 42, wherein manufacturing the ILD layer comprises forming the first low-dielectric constant material sub-layer, second low-dielectric constant material sub-layer, and third low-dielectric constant material sub-layer while adjusting deposition conditions.

46. The method according to claim 45, wherein adjusting the deposition conditions comprises adjusting the gas flow rate, power, or gas species.

47. The method according to claim 42, wherein the first material property, second material property, and third material property comprise density, dielectric constant, adhesion, or Young's modulus.

48. An inter-level dielectric (ILD) layer of a semiconductor device, comprising:
    a first low-dielectric constant material sub-layer, the first low-dielectric constant material having at least one first material property;
    a second low-dielectric constant material sub-layer disposed over the first low-dielectric constant material sub-layer, the second low-dielectric constant material sub-layer having at least one second material property, wherein the at least one second material property is different from the at least one first material property; and
    a third low-dielectric constant material sub-layer disposed over the second low-dielectric constant material sub-layer, the third low-dielectric constant material sub-layer having at least one third material property, the at least one third material property being different from the at least one second material property, wherein the first low-dielectric constant material sub-layer, the second low-dielectric constant material sub-layer, and the third low-dielectric constant material sub-layer form a single ILD layer;
    wherein the first low-dielectric constant material sub-layer, second low-dielectric constant material sub-layer, and third low-dielectric constant material sub-layer comprise methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

49. The ILD layer according to claim 48, wherein the first low-dielectric constant material sub-layer, second low-dielectric constant material sub-layer, and third low-dielectric constant material sub-layer are formed continuously from the same material in one or more deposition chambers.

50. The ILD layer according to claim 48, wherein the first material property, second material property, and third material property comprise density, dielectric constant, adhesion, or Young's modulus.

51. The ILD layer according to claim 48, further comprising at least one fourth low-dielectric constant material sub-layer disposed over the third low-dielectric constant material sub-layer, the fourth low-dielectric constant material sub-layer having at least one fourth material property, wherein the at least one fourth material property is different from the at least one third material property.

52. An inter-level dielectric (ILD) layer of a semiconductor device, comprising:
    a first low-dielectric constant material sub-layer, the first low-dielectric constant material having at least one first material property, and having a dielectric constant less than that of $SiO_2$;
    a second low-dielectric constant material sub-layer disposed over the first low-dielectric constant material sub-layer, the second low-dielectric constant material sub-layer having at least one second material property, wherein the at least one second material property is different float the at least one first material property; and
    a third low-dielectric constant material sub-layer disposed over the second low-dielectric constant material sub-layer, the third low-dielectric constant material sub-layer having a dielectric constant less than that of $SiO_2$, and having at least one third material property, the at least one third material property being different from the at least one second material property, wherein the first low-dielectric constant material sub-layer, the second low-dielectric constant material sub-layer, and the third low-dielectric constant material sub-layer form a single ILD layer;
    wherein the first low-dielectric constant material sub-layer, second low-dielectric constant material sub-layer, and third low-dielectric constant material sub-layer are formed continuously from the same material in one or more deposition chambers.

53. The ILD layer according to claim 52, wherein the first low-dielectric constant material sub-layer, second low-dielectric constant material sub-layer, and third low-dielectric constant material sub-layer comprise methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

54. The ILD layer according to claim 52, wherein the first material property, second material property, and third material property comprise density, dielectric constant, adhesion, or Young's modulus.

55. The ILD layer according to claim 52, further comprising at least one fourth low-dielectric constant material sub-layer disposed over the third low-dielectric constant material sub-layer, the fourth low-dielectric constant material sub-layer having at least one fourth material property, wherein the at least one fourth material property is different from the at least one third material property.

56. An inter-level dielectric (ILD) layer of a semiconductor device, comprising:
    a first low-dielectric constant material sub-layer, the first low-dielectric constant material having at least one first material property;
    a second low-dielectric constant material sub-layer disposed over the first low-dielectric constant material sub-layer, the second low-dielectric constant material sub-layer having at least one second material property, wherein the at least one second material property is different from the at least one first material property;
    a third low-dielectric constant material sub-layer disposed over the second low-dielectric constant material sub-layer, the third low-dielectric constant material sub-layer having at least one third material property, the at least one third material property being different from the at least one second material property, wherein the first low-dielectric constant material sub-layer, the second low-dielectric constant material sub-layer, and the third low-dielectric constant material sub-layer form a single ILD layer; and
    at least one fourth low-dielectric constant material sub-layer disposed over the third low-dielectric constant material sub-layer, the fourth low-dielectric constant material sub-layer having at least one fourth material property, wherein the at least one fourth material property is different from the at least one third material property.

57. The ILD layer according to claim 56, wherein the first low-dielectric constant material sub-layer, second low-dielectric constant material sub-layer, and third low-dielectric constant material sub-layer comprise methylsilsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof.

58. The ILD layer according to claim 56, wherein the first low-dielectric constant material sub-layer, second low-dielectric constant material sub-layer, and third low-dielectric constant material sub-layer are formed continuously from the same material in one or more deposition chambers.

59. The ILD layer according to claim 56, wherein the first material property, second material property, and third material property comprise density, dielectric constant, adhesion, or Young's modulus.

* * * * *

UNITED STATES PATENT AND TRADEMARK OFFICE
CERTIFICATE OF CORRECTION

PATENT NO. : 7,244,673 B2  
APPLICATION NO. : 10/706156  
DATED : July 17, 2007  
INVENTOR(S) : Huang et al.

Page 1 of 1

It is certified that error appears in the above-identified patent and that said Letters Patent is hereby corrected as shown below:

In Col. 10, line 23, delete "law-dielectric" and insert --low-dielectric--.  
In Col. 13, line 33, delete "law-dielectric" and insert --low-dielectric--.  
In Col. 18, line 6, delete "float" and insert --from--.

Signed and Sealed this

Thirty-first Day of March, 2009

JOHN DOLL  
*Acting Director of the United States Patent and Trademark Office*